United States Patent [19]
Miyabe

[11] Patent Number: 6,025,756
[45] Date of Patent: Feb. 15, 2000

[54] OSCILLATION CIRCUIT

[75] Inventor: Satoru Miyabe, Matsudo, Japan

[73] Assignee: Nippon Precision Circuits Inc., Tokyo, Japan

[21] Appl. No.: 09/140,355

[22] Filed: Aug. 26, 1998

[51] Int. Cl.[7] ................................ H03B 5/04; H03B 5/24
[52] U.S. Cl. ................................ 331/57; 331/46; 331/55; 331/172; 331/177 R; 331/175
[58] Field of Search .................................. 331/34, 46, 55, 331/57, 172, 175, 177 R, DIG. 3; 327/274, 280, 281

[56] References Cited

U.S. PATENT DOCUMENTS 5,357,217  10/1994  Marchesi et al. .................... 331/57

*Primary Examiner*—David Mis
*Attorney, Agent, or Firm*—Amster, Rothstein & Ebenstein

[57] ABSTRACT

An oscillation circuit that improves the duty controllability by cross-coupling ring oscillators that are comprised of current inverters. The sources of current supply circuits 4a–4c and 6a–6c are connected to a power supply and their drains are connected to terminals A in corresponding current inverters, respectively. Each of the gates of those current supply circuits receives an output of a current inverter corresponding, one to one, to a current inverter to which the current supply circuit is connected.

2 Claims, 9 Drawing Sheets

OSCILLATION CIRCUIT

FIELD OF THE INVENTION

The present invention relates to an oscillation circuit. More specifically, the invention relates to an oscillation circuit which operates in such a state that two ring oscillators are cross-coupled.

BACKGROUND OF THE INVENTION

FIG. 7(a) shows a conventional oscillation circuit using ring oscillators which oscillates in such a state that two ring oscillators 102 and 103 each composed of an odd number of CMOS inverters 101a–101c are cross-coupled by using inverters 104 and 105. In this case, by virtue of the cross-coupling using CMOS inverters, an oscillation circuit having good duty controllability can be attained.

FIG. 8 shows a ring oscillator constituted of a plurality of current inverters 106. Because in this ring oscillator a signal is transmitted in a current mode, it is more suitable for increasing the operation speed than ring oscillators of a type using CMOS inverters in which a signal is transmitted in a voltage mode (voltage is an integration of current). The current inverter has a feature that it produces less switching noise than the CMOS inverter because a transistor on the power supply side or the ground side serves as a constant current source.

SUMMARY OF THE INVENTION

Problems to be Solved by the Invention

In the case employing CMOS inverters as shown in FIG. 7(a), problems are encountered. FIG. 7(b) is an enlarged diagram of a CMOS inverter 101 used as inverters 101a–101c in FIG. 7(a). A transistor 107 for applying a control bias based on a control bias input that is input from terminal x needs to be connected in series with the CMOS inverter 101. Inverter 101 is composed of a p-channel MOS transistor 108 and an n-channel MOS transistor 109 and the transistor 107 and the inverter 101 are provided between a power supply and the ground. Since three transistors (107, 108 and 109) are connected in series between the power supply and the ground, it is difficult to decrease the power supply voltage. Further, because of the use of CMOS inverters, there is a problem of switching noise.

The case employing current inverters is more suitable for decreasing the power supply voltage than the case employing CMOS inverters because only one p-channel MOS transistor and only one n-channel transistor are connected in series between a power supply and the ground. However, since no CMOS inverters are used, the case employing current inverters is inferior to the case employing CMOS inverters in duty controllability.

In order to improve the duty controllability of the case with current inverters, two ring oscillators with current inverters would be cross-coupled by using current inverters for cross-coupling so that inverted outputs are generated and transmitted to each other similar to the case shown in FIG. 7(a). Such a circuit is shown in FIG. 9(a). FIG. 9(b) is an enlarged diagram of the main part of FIG. 9(a). Two self-biased transistors are connected to each other at one terminal as shown in FIG. 9(b) and hence this circuit is rendered inoperative. That is, a circuit that is formed so that the ring oscillators supply their inverted outputs to each other as in the case shown in FIG. 7(a), is inoperative.

Solution for the Problem

According to the present invention, in an oscillation circuit in which first and second ring oscillators each comprising of a plurality of current inverters having constant current sources are cross-coupled, a first current supply circuit supplies a current corresponding to an output current of at least one first current inverter of the first ring oscillator to a constant current source of one second current inverter of the second ring oscillator, and a second current supply circuit supplies a current corresponding to an output current of the second current inverter to a constant current source of the first current inverter. In this manner, cross-coupling of two ring oscillators comprised of current inverters can be realized by transmitting current outputs of the first and second current inverters to each other's constant current sources without inverting them. Therefore, a reduction of the power supply voltage, an increase of the operation speed, noise reduction, and good duty controllability can be attained at the same time.

Further, the present invention is possible in which the current inverters of the first ring oscillator correspond, one to one, to the current inverters of the second ring oscillator, respectively, a plurality of first current supply circuits supply currents corresponding to output currents of the respective current inverters of the first ring oscillator to the constant current sources of the corresponding current inverters of the second ring oscillator, respectively, and a plurality of second current supply circuits supply currents corresponding to output currents of the respective current inverters of the second ring oscillator to the constant current sources of the corresponding current inverters of the first ring oscillator, respectively.

According to the present invention, there is provided an oscillation circuit in which first and second ring oscillators are cross-coupled, each of the first and second ring oscillators being comprised of a plurality of current inverters having constant current sources, the oscillation circuit further comprising a first current supply circuit for supplying a current corresponding to an output current of at least one first current inverter of the first ring oscillator to a constant current source of one second current inverter of the second ring oscillator; and a second current supply circuit for supplying a current corresponding to an output current of the second current inverter to a constant current source of the first current inverter.

According to the present invention, there is provided an oscillation circuit in which first and second ring oscillators are cross-coupled, each of the first and second ring oscillators being comprised of a plurality of current inverters having constant current sources, and the current inverters of the first ring oscillator corresponding, one to one, to the current inverters of the second ring oscillator, respectively, the oscillation circuit further comprising a plurality of first current supply circuits for supplying currents corresponding to output currents of the respective current inverters of the first ring oscillator to the constant current sources of the corresponding current inverters of the second ring oscillator, respectively; and a plurality of second current supply circuits for supplying currents corresponding to output currents of the respective current inverters of the second ring oscillator to the constant current sources of the corresponding current inverters of the first ring oscillator, respectively.

BRIEF DESCRIPTION OF THE DRAWINGS

The invention is illustrated by way of example and not limitation in the figures of the accompanying drawings in which like reference numbers denote like or corresponding parts and in which.

DESCRIPTION OF THE PREFERRED EMBODIMENTS

The present invention will be hereinafter described in detail in the form of preferred embodiments with reference to the drawings.

Figure 1:
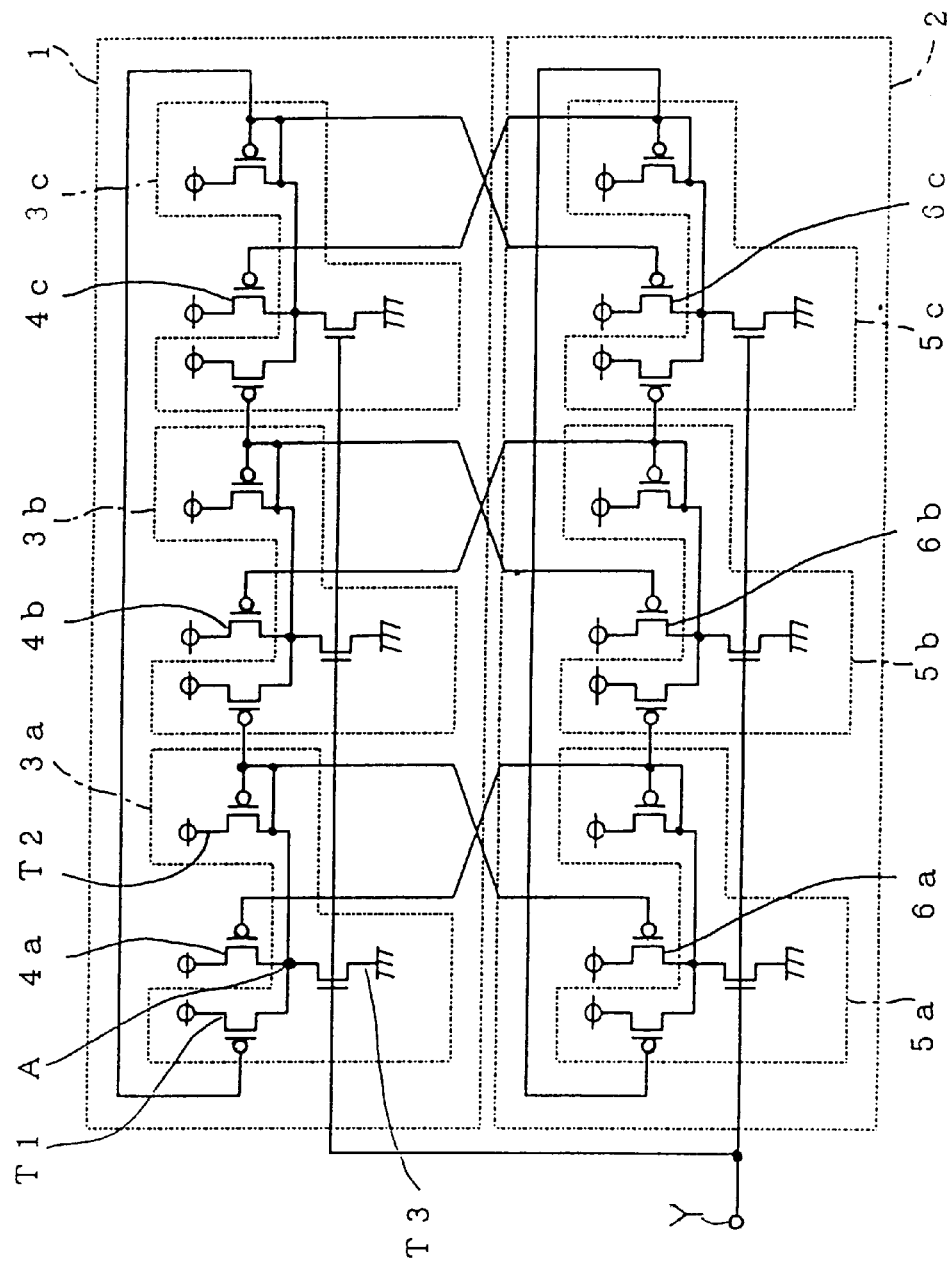
FIG. 1 is a circuit diagram showing an embodiment of the present invention.

In FIG. 1, numerals 1 and 2 denote first and second ring oscillators, respective ly. The first ring oscillator 1 is formed of current inverters 3a–3c and second current supply circuits 4a–4c. The second ring oscillator 2 is formed of current inverters 5a–5c and first current supply circuits 6a–6c. The current supply circuits 4A–4C are provided so as to correspond to the respective current inverters 5a–5c. There is one-to-one correspondence between the current inverters 3a–3c and the current inverters 5a–5c, respectively. Since the current inverters 3a–3c and 5a–5c have the same structure, only the structure of the current inverter 3a will be described below for the sake of brevity.

The current inverter 3a is composed of p-channel MOS transistors T1 and T2 and an n-channel MOS transistor T3 that constitutes a constant current source. The sources of the transistors T1 and T2 are connected to a power supply and both of their drains are connected to terminal A. The gate of the transistor T1 is connected so as to receive an output of the current inverter 3c of the preceding stage. The gate of the transistor T2 is connected to its drain and is thus self-biased. The source of the transistor T3 is connected to the ground and its drain is connected to terminal A. A control bias signal that is input from terminal Y is input to the gate of the transistor T3.

Each of the current supply circuits 4a–4c and 6a–6c is a p-channel transistor. The sources of the current supply circuits 4a–4c and 6a–6c are connected to a power supply, and their drains are connected to terminals A of the corresponding current inverters, respectively. The gate of each of the current supply circuits 4a–4c and 6a–6c receives an output of the current inverter that corresponds, one to one, to the current inverter to which the current supply circuit is connected.

Figure 2:
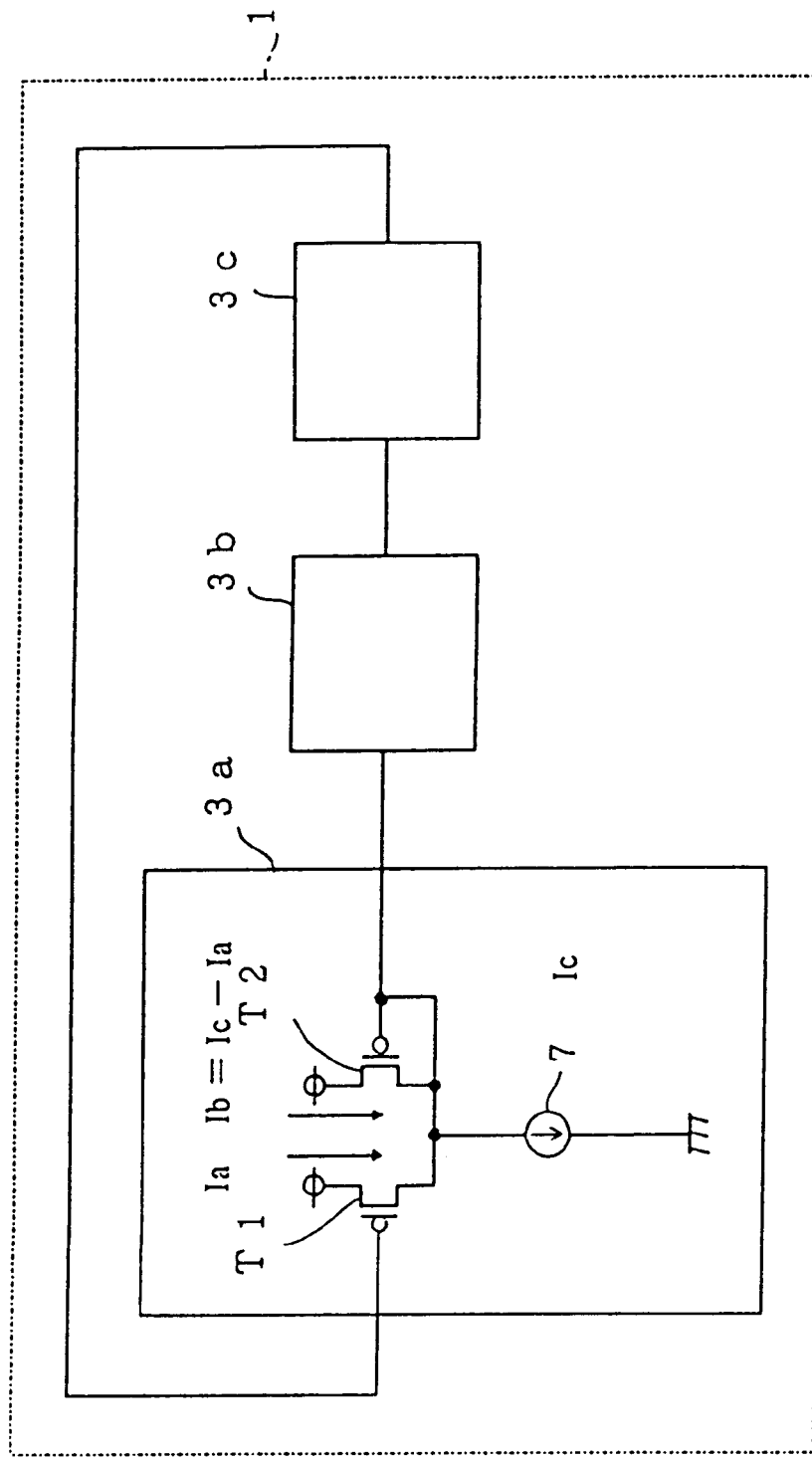
FIG. 2 is an explanation diagram for description of operation of FIG. 1.
Figure 3:
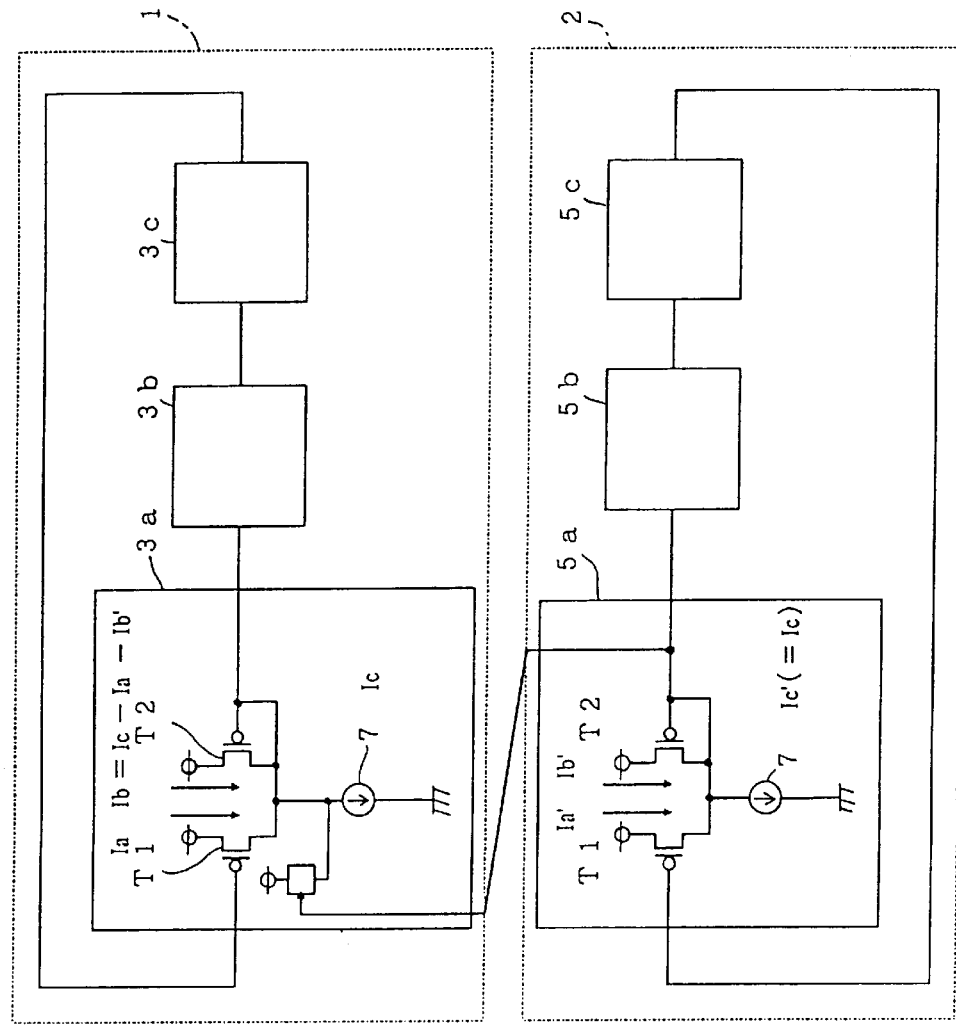
FIG. 3 is an explanation diagram for description of operation of FIG. 1.
Figure 4:
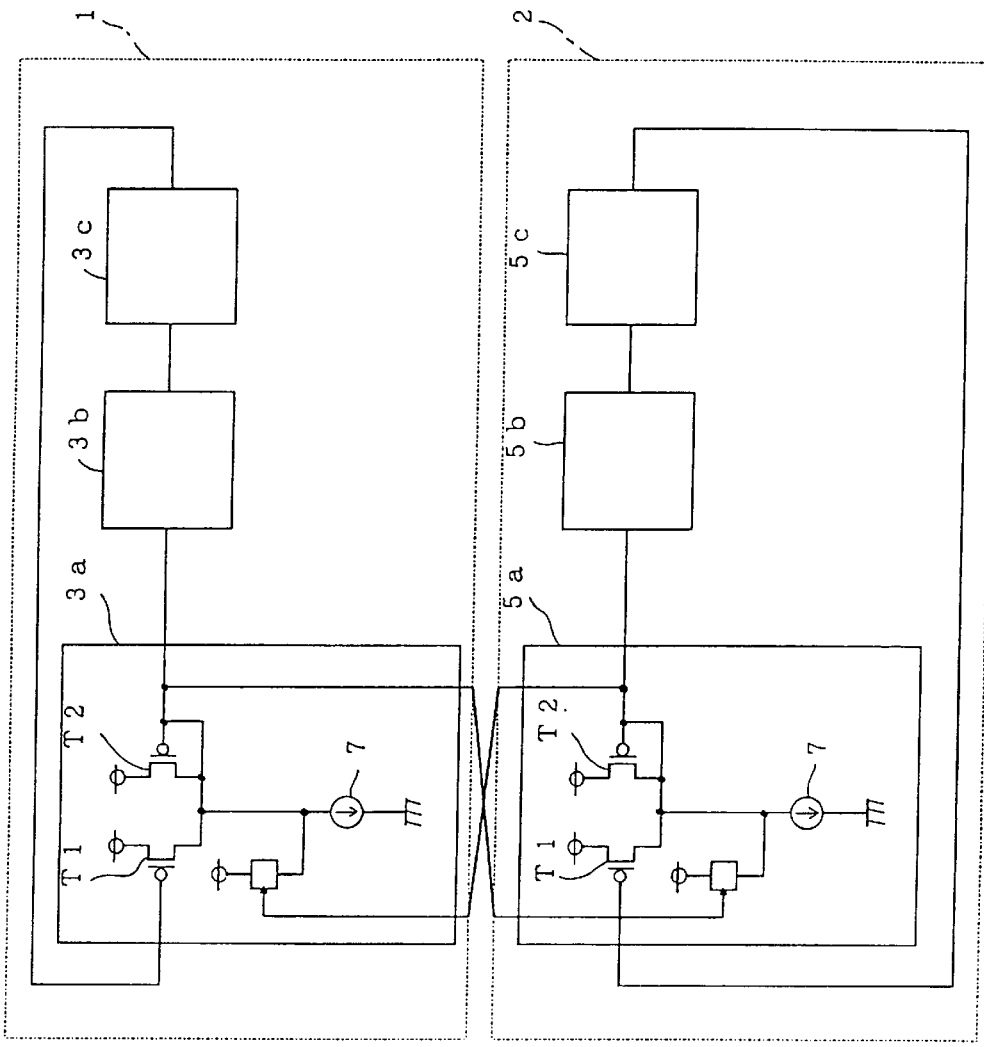
FIG. 4 is an explanation diagram for description of operation of FIG. 1.

Next, the principle of operation will be described with reference to FIGS. 2–4. In FIGS. 2–4, the components given the same reference symbols as the corresponding components in FIG. 1 are the same as the latter and the transistor T3 is shown as a constant current source 7 for simplification of the description.

FIG. 2 shows the current inverter 3a in the first ring oscillator 1.

In FIG. 2, with Ic representing the value of a constant current flowing through the constant current source 7, in the current inverter 3a, the output–side transistor T2 generates a current mirror voltage output that corresponds to a current value Ib=Ic–Ia that remains after subtracting, from Ic, Ia where Ia indicates the value of a current flowing through the input-side transistor T1.

Now, the second ring oscillator 2 is added as shown in FIG. 3. Let Ic' and Ia' denote the value of a constant current flowing through the constant current source 7 and the value of a current flowing through the input-side transistor T1, respectively, in the current inverter 5a that corresponds to the current inverter 3a. Where the output voltage of the output-side transistor T2 of the current inverter 5a is a current mirror voltage output corresponding to Ib'=Ic'–Ia' where (Ic'=Ic), if a current having the same phase as this voltage output is caused to flow into the constant current source 7 of the current inverter 3a, the current flowing through the output-side transistor T2 of the current inverter 3a has a value that remains after subtracting Ia and Ib' from the constant current value Ic, that is, Ib=Ic–Ia–Ib'. That is, the ring oscillator 2 causes the output-side transistor T2 of the current inverter 3a to have a current variation whose phase is opposite to the phase of the current variation in the output-side transistor T2 of the corresponding current inverter 5a.

Cross-coupling is completed by causing the output of the current inverter 3a to flow into the constant current source 7 of the current inverter 5a as shown in FIG. 4. That is, cross-coupling of two ring oscillators using current inverters is realized by utilizing the operation that an opposite-phase variation occurs in the self current inverter upon reception of an output having the same phase as a variation in the counterpart current inverter. Where an output current of the corresponding current inverter is actually caused to flow into the constant current source 7, the output current is multiplied by a constant value by adjusting the size of the transistor that constitutes the current supply circuit.

Since two ring oscillators each comprised of a plurality of current inverters can be cross-coupled in the above manner, the duty controllability is increased. Further, the duty controllability can be improved without impairing the advantages of ring oscillators formed of current inverters, that is a reduction of the power supply voltage, high operation speed, the reduction of the switching noise, etc.

Further, by virtue of the cross-coupling, common mode noises such as noise that is introduced through a power supply can be reduced. That is, even if there occurs common mode noise that changes Ib and Ib' to Ib+ΔI and Ib'+ΔI, respectively, the noise ΔI is cancelled out (reduced) because the cross-coupling causes generation of a current whose phase is opposite to the phase of ΔI.

Next, another embodiment of the invention will be described with reference to FIG. 5.

Figure 5:
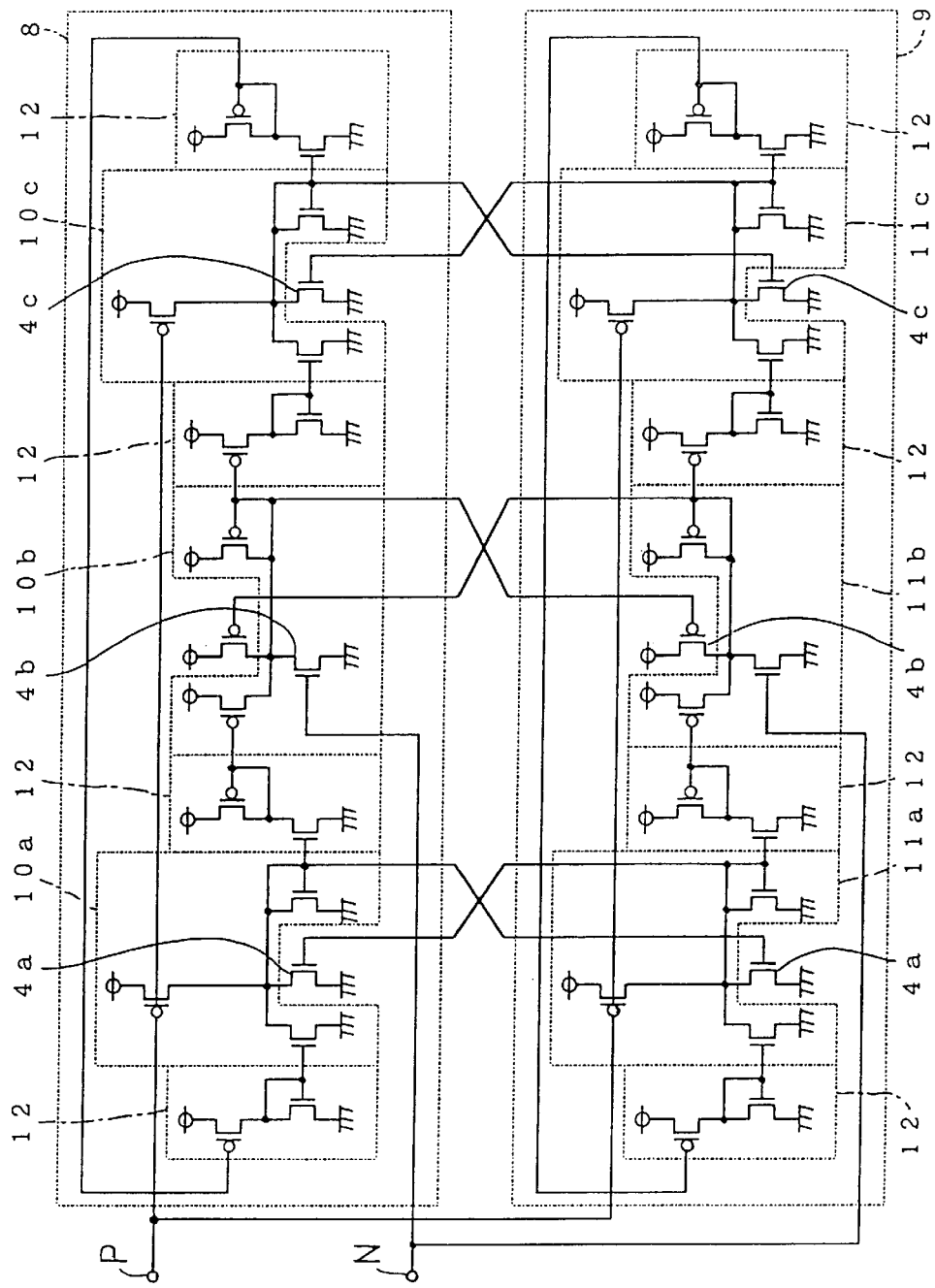
FIG. 5 is a circuit diagram showing another embodiment of the invention.

While the example of FIG. 1 is such that the operation transistors of every current inverter are p-channel MOS transistors, the example of FIG. 5 describes an embodiment in which a p-channel MOS transistor and an n-channel MOS transistor operate alternately on as many occasions as possible.

In FIG. 5, each of the first and second ring oscillators 8 and 9 is comprised of current inverters 10a–10c and 11a–11c, respectively. The polarity of the current inverters 10a, 10c, 11a, and 11c is opposite to that of the current inverters shown in FIG. 1, and the polarity of the current inverters 10b and 11b is the same as that of the current inverters shown in FIG. 1.

In this case, because of the use of the current inverters having different polarities, transistors forming constant current sources are two kinds of transistors, that is, a p-channel MOS transistor and an n-channel MOS transistor, which receive a p-channel control bias signal and an n-channel control bias signal that are input from terminals P and N, respectively. Each ring oscillator is provided with a polarity inversion circuit 12 between the adjacent current inverters.

The oscillation circuit of FIG. 5 operates approximately in the same manner and has the same advantages as that of FIG. 1.

Figure 6:
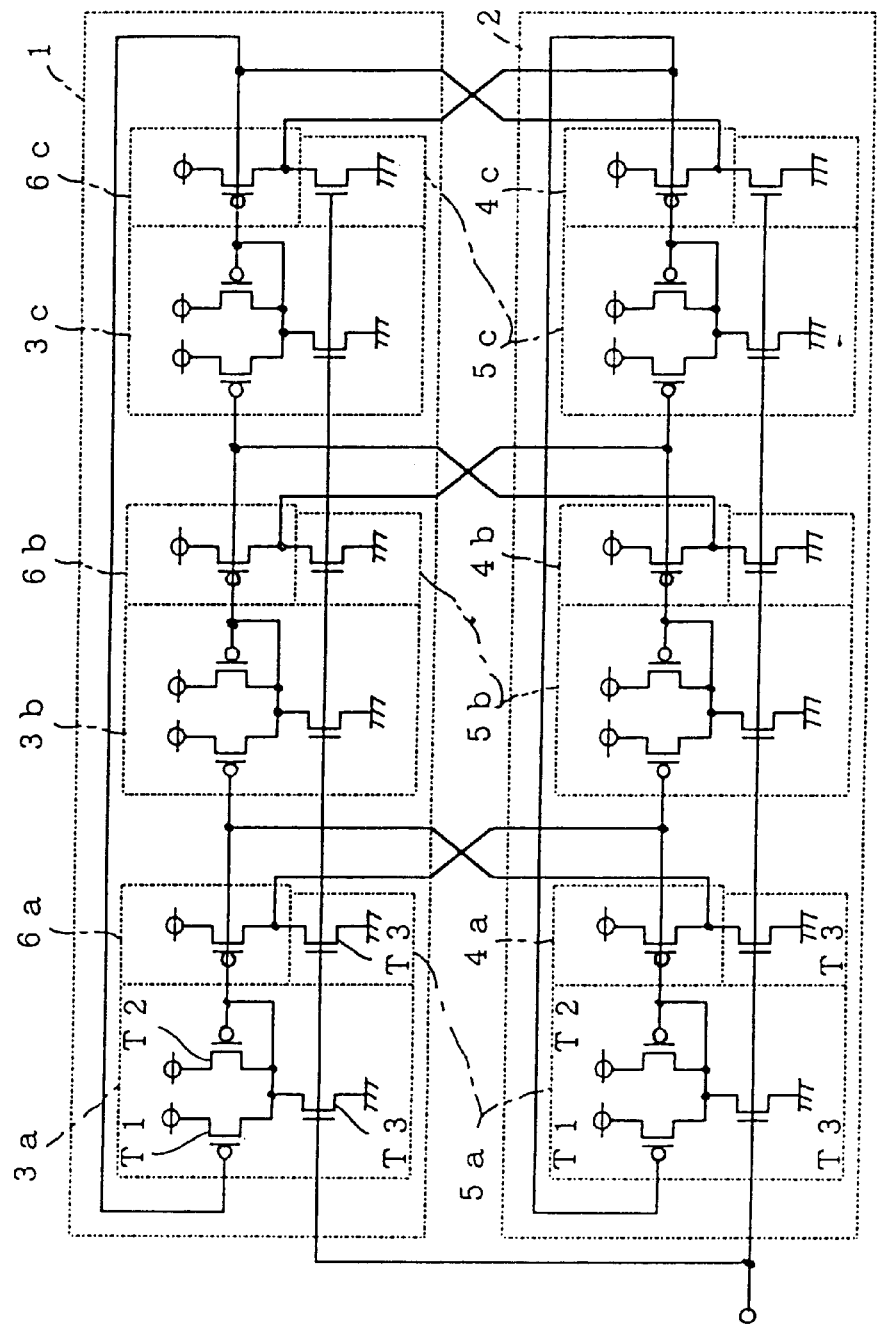
FIG. 6 is a circuit diagram showing still another embodiment of the invention.
Figure 7:
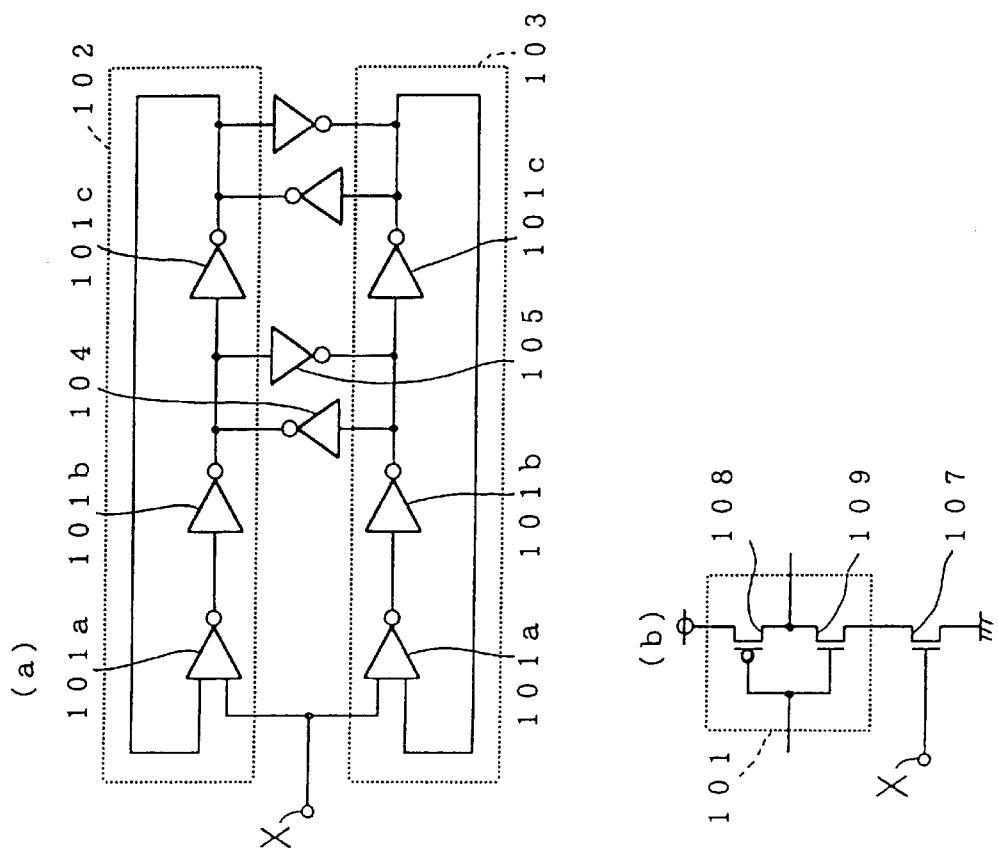
FIG. 7 is a diagram showing a conventional oscillation circuit.
Figure 8:
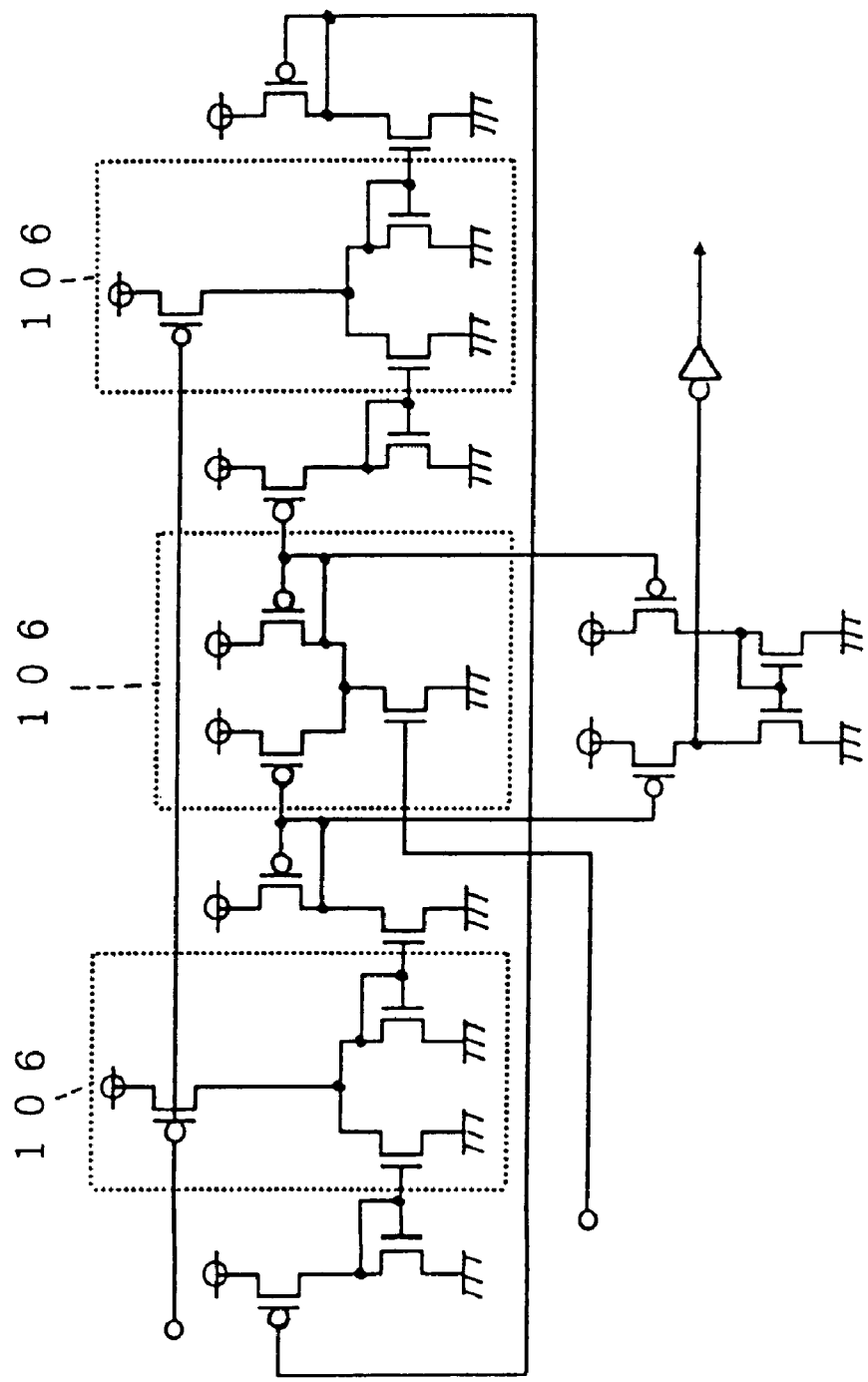
FIG. 8 is a diagram showing another conventional oscillation circuit.
Figure 9:
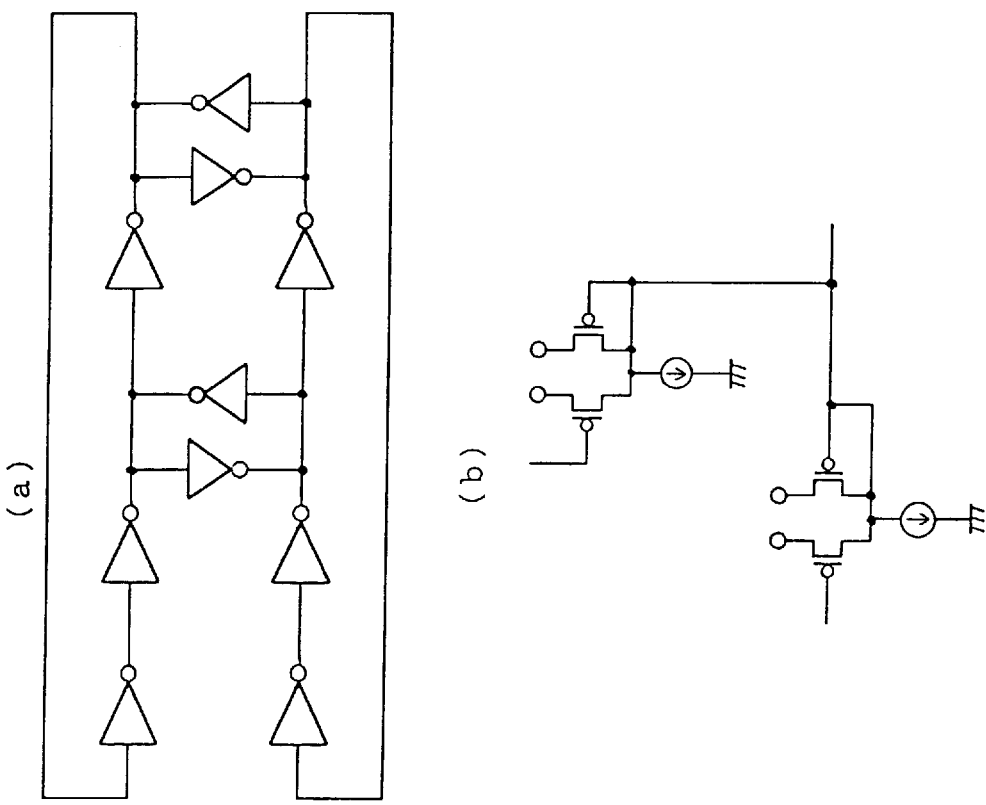
FIG. 9 is an explanation diagram showing an example in which the oscillation circuits of FIGS. 7 and 8 are simply combined with each other in an expected manner.

The same advantages as in the above examples can also be obtained by the embodiment shown in FIG. 6. In FIG. 6, the components given the same reference symbols as the corresponding components in FIG. 1 are the same.

The circuit of FIG. 6 is a modification of the circuit of FIG. 1. Specifically, the series circuit of the second current supply circuit 4a and the constant current circuit T3 that is provided in the first ring oscillator 1 in FIG. 1 is now provided in the second ring oscillator 2, and the series circuit of the first current supply circuit 6a and the constant current circuit T3 that is provided in the second ring oscillator 2 in FIG. 1 is now provided in the first ring oscillator 1.

The invention provides many advantages. According to the invention, the power supply voltage can be reduced, the operation speed can be increased, the noise can be reduced, and good duty control can be performed in an oscillation circuit.

Although the invention has been described with reference to the preferred embodiments, it will be apparent to one skilled in the art that variations and modifications are contemplated within the spirit and scope of the invention. The drawings and description of the preferred embodiments are made by way of example rather than to limit the scope of the invention, and it is intended to cover within the spirit and scope of the invention all such changes and modifications.

I claim:

1. An oscillation circuit in which first and second ring oscillators are cross-coupled, comprising:

each of the first and second ring oscillators being comprised of a plurality of current inverters having constant current sources, the oscillation circuit further comprising:

a first current supply circuit for supplying a current corresponding to an output current of at least one first current inverter of the first ring oscillator to a constant current source of one second current inverter of the second ring oscillator; and a second current supply circuit for supplying a current corresponding to an output current of the second current inverter to a constant current source of the first current inverter.

2. An oscillation circuit in which first and second ring oscillators are cross-coupled, comprising:

each of the first and second ring oscillators being comprised of a plurality of current inverters having constant current sources, and the current inverters of the first ring oscillator corresponding, one to one, to the current inverters of the second ring oscillator, respectively, the oscillation circuit further comprising:

a plurality of first current supply circuits for supplying currents corresponding to output currents of the respective current inverters of the first ring oscillator to the constant current sources of the corresponding current inverters of the second ring oscillator, respectively; and a plurality of second current supply circuits for supplying currents corresponding to output currents of the respective current inverters of the second ring oscillator to the constant current sources of the corresponding current inverters of the first ring oscillator, respectively.

* * * * *